US010483485B2

(12) United States Patent
Oukassi

(10) Patent No.: US 10,483,485 B2
(45) Date of Patent: Nov. 19, 2019

(54) DEVICE FOR ENCAPSULATING A SENSITIVE DEVICE AND PROCESS FOR PRODUCING SAID DEVICE

(71) Applicant: COMMISSARIAT A L'ENERGIE ATOMIQUE ET AUX ENERGIES ALTERNATIVES, Paris (FR)

(72) Inventor: Sami Oukassi, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 750 days.

(21) Appl. No.: 14/525,656

(22) Filed: Oct. 28, 2014

(65) Prior Publication Data

US 2015/0118544 A1  Apr. 30, 2015

(30) Foreign Application Priority Data

Oct. 29, 2013  (FR) .................................... 13 60521

(51) Int. Cl.
*H01M 2/02* (2006.01)
*H01L 51/52* (2006.01)
*H01L 51/56* (2006.01)

(52) U.S. Cl.
CPC .......... *H01L 51/5246* (2013.01); *H01L 51/56* (2013.01); *H01M 2/02* (2013.01);
(Continued)

(58) Field of Classification Search
CPC ..... H01L 15/52; H01L 51/56; H01L 51/5246; H01L 2251/558; H01M 2/02;
(Continued)

(56) References Cited

U.S. PATENT DOCUMENTS 6,410,086 B1 * 6/2002 Brandon ............... C23C 16/045
204/471
2002/0137260 A1  9/2002 Leung et al.
(Continued)

FOREIGN PATENT DOCUMENTS

WO       03094256 A2    11/2003
WO    2008057045 A1     5/2008
(Continued)

OTHER PUBLICATIONS

Wang et. all Chem. Mater. 2001, 13, 364-371 (Year: 2001).*
(Continued)

*Primary Examiner* — Alexander Usyatinsky
(74) *Attorney, Agent, or Firm* — Baker and Hostetler LLP

(57) ABSTRACT

An encapsulation device comprises at least one assembly containing particles comprising at least a first material. The assembly has an open porosity. The particles: are distributed over a geometric structure that has a degree of compactness of said particles of greater than around 50% and preferably of greater than 60%, and are covered conformally by at least one layer referred to as an infiltration layer; the thickness of at least the infiltration layer closing off the porosity of the assembly comprising the particles covered by at least the layer, in the form of pores that are not connected to one another. A process for producing the encapsulation device is also provided.

26 Claims, 5 Drawing Sheets

(52) U.S. Cl.
CPC ..... H01M 2/0202 (2013.01); *H01L 2251/558* (2013.01); *Y10T 428/25* (2015.01); *Y10T 428/254* (2015.01)

(58) Field of Classification Search
CPC .............. H01M 2/0202; C23C 16/403; C23C 16/4417; C23C 16/45555; C23C 16/045; Y10T 428/25; Y10T 428/254
See application file for complete search history.

(56) References Cited

U.S. PATENT DOCUMENTS

| | | | |
|---|---|---|---|
| 2003/0161986 A1* | 8/2003 | Yamamoto | C23C 14/0036 428/64.1 |
| 2011/0212320 A1* | 9/2011 | Greenhill | A42B 3/12 428/313.3 |
| 2013/0092230 A1 | 4/2013 | Pereira et al. | |
| 2014/0252342 A1* | 9/2014 | Ramadas | H01L 21/56 257/40 |
| 2015/0118544 A1* | 4/2015 | Oukassi | H01L 51/5246 429/163 |

FOREIGN PATENT DOCUMENTS

| | | |
|---|---|---|
| WO | 2008094352 A1 | 8/2008 |
| WO | 2011161632 A1 | 12/2011 |
| WO | 2012044522 A1 | 4/2012 |
| WO | 2013052486 A1 | 5/2013 |
| WO | 2013062486 A1 | 5/2013 |

OTHER PUBLICATIONS

Notification to grant a Patent issued by SIPO (China) for Application No. 201410729468.4 (Year: 2017).*

G. Zhavnerko, et al., "Developing Langmuir-Blodgett Strategies Towards Practical Devices", Material Science and Engineering B, 2010, pp. 43-48, vol. 169, Elsevier B.V.

Anup Ramachandran, et al., "A Study of Parylene C Polymer Deposition Inside Microscale Gaps", IEEE Transactions on Advanced Packaging, Nov. 2007, pp. 712-724, vol. 30, No. 4, IEEE.

William F. Gorham, "A New, General Synthetic Method for the Preparation of Linear Poly p-xylylenes", Journal of Polymer Science: Part A-1, 1966, pp. 3027-3039, vol. 4.

D. Wang et al., "Synthesis of Macroporous Titania and Inorganic Composite Materials from Coated Colloidal Spheres—A Novel Route to Tune Pore Morphology," Chemistry of Materials, vol. 13, No. 2, Feb. 1, 2001, pp. 364-371, XP055466858.

* cited by examiner

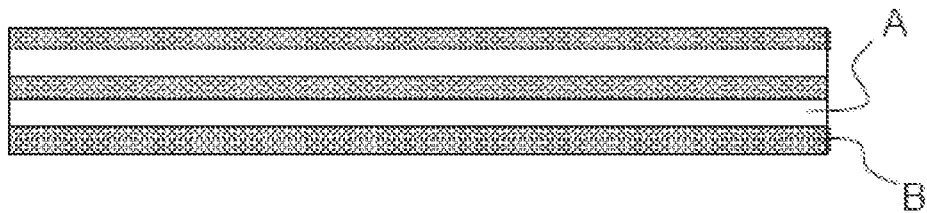
FIG.1a
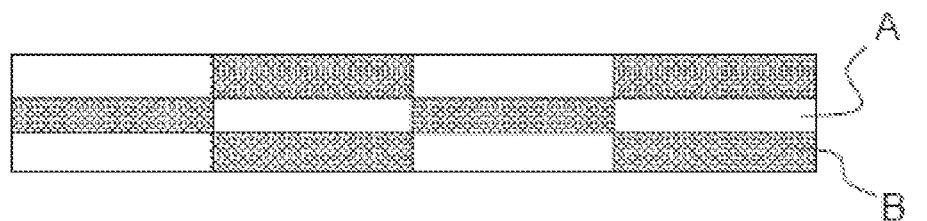
FIG.1b
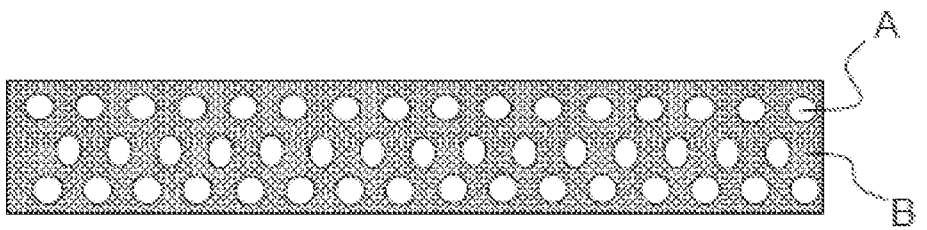
FIG.1c
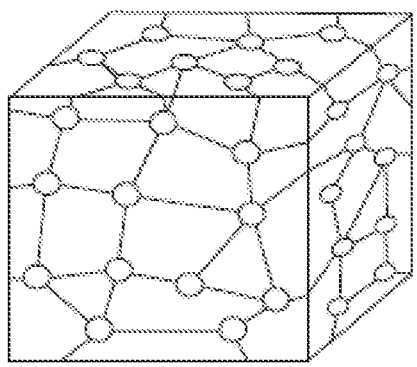 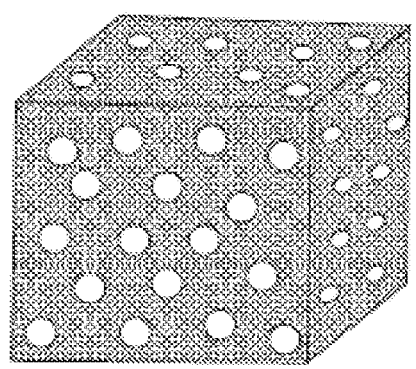
FIG.2a            FIG.2b

DEVICE FOR ENCAPSULATING A SENSITIVE DEVICE AND PROCESS FOR PRODUCING SAID DEVICE

CROSS-REFERENCE TO RELATED APPLICATION

This application claims priority to foreign French patent application No. FR 1360521, filed on Oct. 29, 2013, the disclosure of which is incorporated by reference in its entirety.

FIELD OF THE INVENTION

The field of the invention is that of the encapsulation of devices that are very sensitive and chemically unstable. These devices may notably be lithium microbatteries, organic light-emitting diodes (OLEDs), etc. Such devices in general have highly hygroscopic materials and therefore must be protected from the ambient atmosphere by an encapsulation device possessing one or more encapsulating layers. The encapsulation device must have, in this case, very low permeation to oxygen and to water vapour (approximate transmission rate of $10^{-6}$ $g \cdot m^{-2} \cdot day^{-1}$) and prevent the diffusion of these molecules towards the sensitive materials.

BACKGROUND

Several approaches have been tackled regarding the reduction of the permeation of an encapsulation device and the increase of the barrier effect. These approaches are often based on two principles:
  compartmentalizing the permeation failings, the principle consisting in creating several small domains that may be beads, delimited by a controlled interface; consequently if there is a permeation failing (microcrack or nanocrack, micropore or nanopore) that passes through the entire volume of the bead and which allows molecules of $O_2/H_2O$ to penetrate towards the system to be encapsulated, this failing is delimited by the interface domains created between the beads, and the propagation is stopped at the bead. The failing is thus compartmentalized within a domain, which avoids having continuous diffusion pathways in the whole structure;
  lengthening the (oxygen, water vapour) diffusion pathway in the encapsulation device.
  Generally, these two principles are implemented by applying one (or more) of the following methods:
  an alternation of layers of at least two materials A and B, referred to as nano- or micro-layering, as shown schematically in FIG. 1a. This method is used for example in patent application WO 2003/094256 which has a stack with alternating organic/inorganic material. This solution makes it possible to lengthen the diffusion pathway and thus to slow down the reaction kinetics of the sensitive materials. The solution described in this document has drawbacks such as a thickness of the complete stack that is too large for certain applications, and also a very high production cost linked to the number of depositions;
  the creation of two-dimensional or three-dimensional shapes in a material of the encapsulation device, referred to as nano- or micro-texturing, as shown schematically in FIG. 1b, which illustrates compartments of material A and compartments of material B. This method is used for example in patent application WO 2008/094352. The stack described in this application comprises one or more layers having at least two sections which, once covered by a continuous layer, makes it possible to create discontinuities and to thus compartmentalize the permeation failings. But this solution has drawbacks such as the incompatibility of the structuring technique (mechanical masks, etching, laser ablation) with the presence of sensitive materials underneath the encapsulation stack, and also a very high production cost linked to the number of depositions and to the structuring methods;
  the incorporation of inclusions of material A in a layer of the stack of material B, referred to as nano- or micro-structuring, as shown schematically in FIG. 1c. The inclusions are structures that are generally active, often acting as a site for trapping oxygen or water vapour, and are commonly known as "getters". Patent applications WO 2008/057045 and WO 2013/062486 describe solutions that use the microstructuring principle. Indeed, in these documents, particles in a polymer matrix are proposed: the presence of layers composed of microparticles in a polymer matrix and the presence of a layer of functionalized microparticles that are coated in a polymer. These solutions described in these documents nevertheless have drawbacks, such as an effective encapsulation time linked to the time until saturation of the "getter" particles, and also large thicknesses.

Furthermore, these solutions do not propose an ordered structure of the particles and do not make it possible to control the interfaces between the particles.

SUMMARY OF THE INVENTION

This is why, in this context, the present invention proposes a solution that provides increased performances in terms of encapsulation due to a high compactness linked to an ordered structure of the particles and also the possibility of depositing one or more materials at the interfaces of said particles. This combination of means thus contributes to improving the performances in terms of permeation.

More specifically, one subject of the present invention is an encapsulation device comprising at least one assembly containing particles comprising at least a first material, said assembly having an open porosity,
  said particles:
    being distributed over a geometric structure that has a degree of compactness of said particles of greater than around 50% and
    being covered conformally by at least one layer referred to as an infiltration layer;
  the thickness of at least said infiltration layer closing off the porosity of the assembly comprising the particles covered by at least said layer, in the form of pores that are not connected to one another.

The degree of compactness is defined as being the degree of filling of the space by the particles.

Advantageously, this degree of compactness is greater than 60%.

Thus, the proposed device may constitute one solution for a thin, low-cost encapsulation device that makes it possible to avoid the aforementioned limitations of the known art.

According to one variant of the invention, said device comprises a substrate on which said assembly containing said particles is produced.

According to one variant of the invention, the substrate may be a functional support or a cover.

According to one variant of the invention, said substrate has a thickness of a few tens of microns.

According to one variant of the invention, said geometric structure is compact hexagonal or face-centred cubic.

According to one variant of the invention, the first material is of oxide, carbide, oxycarbide or polymer type.

According to one variant of the invention, said particles are covered with at least one infiltration layer composed of oxide or nitride or oxynitride or polymer.

According to one variant of the invention, said particles are covered with at least a first infiltration layer made of oxide or nitride or oxynitride, and a second infiltration layer made of polymer that may belong to the family of parylenes.

According to one variant of the invention, the particles have sizes between around a few tens of nanometres and a few microns.

According to one variant of the invention, the particles have at least two different sizes, making it possible to produce a particle size gradient, the gradient being obtained going from the substrate, with a succession of layers.

According to one variant of the invention, the device comprises particles of at least two types of materials, a first type of material having a higher permeability for $O_2$ molecules than for $H_2O$ molecules, the second type of material having a higher permeability for $H_2O$ molecules than for $O_2$ molecules.

According to one variant of the invention, the thickness of the infiltration layer is less than around one micron.

According to one variant of the invention, said assembly comprising said particles has a thickness between around 1 micron and 5 microns.

Another subject of the invention is a device comprising a sensitive device and an encapsulation device according to the invention, positioned on one face of said sensitive device.

According to one variant of the invention, said encapsulation device comprises a substrate that may be transferred to the sensitive device.

The sensitive device may notably be a microbattery or an organic light-emitting diode.

According to one variant of the invention, the device comprises a sealing adhesive between said sensitive device and said encapsulation device.

Yet another subject of the invention is a process for producing an encapsulation device according to the invention, characterized in that it comprises the following steps:
production of an assembly containing particles comprising at least a first material, said assembly having an open porosity, said particles being distributed over a geometric structure that has a degree of compactness of said particles of greater than around 50% and preferably of greater than 60%;
infiltration of said assembly of particles by at least one infiltration layer deposited by a conformal technique, making it possible to deposit said infiltration layer around said particles, making it possible to close off said porosity, open before this deposition step, in the form of pores that are not connected to one another.

According to one variant of the invention, the compact assembly of particles is produced by a technique for transferring an assembly of colloidal monolayers in a transfer liquid to the surface of a substrate.

According to the present invention, the porous layer of particles may advantageously be produced by a Langmuir Blodgett or Langmuir Shaefer technique (this type of technique consists in transferring one or more monolayers of particles to a support and precisely controlling the geometry of the structure obtained).

According to one variant of the invention, the infiltration step is carried out by atomic layer deposition (commonly known as ALD) of thin films.

According to one variant of the invention, the infiltration step is carried out by chemical vapour deposition, commonly known as CVD, or plasma-enhanced chemical vapour deposition.

BRIEF DESCRIPTION OF THE DRAWINGS

The invention will be better understood and other advantages will appear on reading the following description, given with no implied limitation, and by virtue of the appended figures, among which:

FIGS. 1a, 1b and 1c illustrate encapsulation solutions from the prior art comprising the combination of material A and material B;

FIGS. 2a and 2b respectively illustrate assemblies with open porosity and with closed porosity;

DETAILED DESCRIPTION

Generally, the encapsulation device proposed in the present invention is composed of at least one assembly of particles having great compactness, that is to say having a high degree of filling of the space by the particles, which may typically be greater than 50% and preferably greater than 60%, on a given substrate and having an open porosity.

The open porosity is defined by an assembly of connected pores that contributes to the permeability of a material and is illustrated in FIG. 2a. It may be a void network within the material which enables a fluid, or a stream of molecules to pass through it in volume in one spatial direction.

Conversely, a closed porosity is formed by an assembly of pores that do not contribute to the permeability and that cannot therefore be accessed by a fluid or by a stream of molecules and is illustrated in FIG. 2b.

According to the invention, the void network is thus filled in at least partly by infiltration of one or more deposited layers.

More specifically, within the context of the invention, the pores are the empty spaces between the particles before deposition of the infiltration layer. These empty spaces are connected: there is a percolation pathway which gives the assembly formed by the particles its permeability with respect to a given fluid or a stream of molecules. This leads to a permeation and consequently a degradation of the barrier properties of the assembly formed by the particles, before deposition of the infiltration layer.

Figure 3:
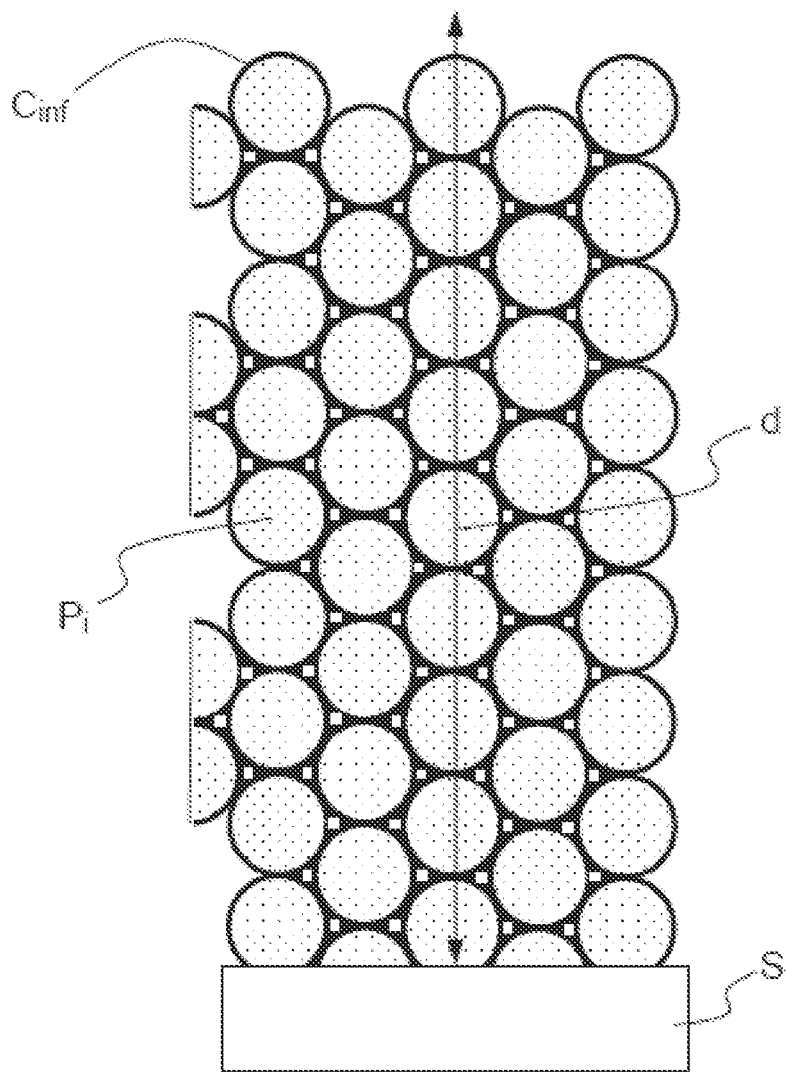
FIG. 3 illustrates an assembly having particles in an organized geometric structure and covered with at least one infiltrated layer, in an encapsulation device according to the invention.

FIG. 3 illustrates an assembly of geometrically organized particles used in an encapsulation device of the invention. Particles Pi are placed in an organized structure and are covered with at least one infiltration layer $C_{inf}$ at the surface of a substrate S. The assembly of about ten particles stacked up from the substrate typically makes it possible to attain an assembly height that may be of the order of a few microns.

In order to produce the encapsulation device of the present invention, it is necessary firstly to produce the assembly comprising particles organized according to a given geometric structure type and having an open porosity.

One particularly suitable technique is based on a Langmuir-Blodgett method. Such a method is notably described in the article from Materials Science and Engineering B, vol. 169-year 2010-pages 43-48).

It is thus possible to produce, on a substrate, a stack of monolayers of spherical particles, for example of $SiO_2$ or $Al_2O_3$, in opal structure, which on the micrometre scale is composed of hydrated silica (for example) spheres of the same diameter (between 150 and 300 nm) stacked either in a compact hexagonal structure, or in a face-centred cubic structure.

According to the invention, any other structure is possible if it makes it possible to obtain a stack of particles having great compactness, typically greater than 60%. It should be noted that a very great compactness of 74% may be obtained for the compact hexagonal stack and the face-centred cubic stack.

Thus, these very compactly organized particles make it possible to ensure a very low permeation, by preventing the passage of molecules of $O_2/H_2O$ type, at the same time as they create a large ratio in terms of bead external surface area/surface area on substrate and therefore make it possible to have an extremely high number of compartments.

Secondly, the infiltration operation of an infiltration layer is carried out. This operation may notably be carried out by conformal deposition techniques such as the atomic layer deposition (commonly known as ALD) of thin films, the principle consisting in exposing a surface successively to various chemical precursors in order to obtain ultrathin infiltration layers, or by plasma-enhanced chemical vapour deposition (PECVD) or else by chemical vapour deposition (CVD) or by low-pressure chemical vapour deposition (LP-CVD).

These deposition techniques make it possible to attain very small thicknesses of infiltration layer, typically less than one micron and preferably less than one hundred nanometres. The infiltration layer infiltrates the structure and covers the entire outer surface of the particles, advantageously of the beads and thus forms the inter-bead interfacial medium.

The infiltration layer or layers deposited fill in the whole of the volume of the porosity except a portion that remains in the form of empty pockets (that are separated from one another). The infiltration layer or layers cover the whole of the developed surface of the structure except the points of contact between the particles.

This (or these) infiltration layer(s) that is deposited over a very large surface of the assembly of particles thus makes it possible to:
  fill in bead surface defects;
  separate the beads (compartments) with a material that has low permeation;
  increase the diffusion pathway of the $O_2/H_2O$ molecules.

Advantageously, a second infiltration layer which may be of polymer type and for example a parylene, may also be deposited, by vacuum polymerization (as described in the article: IEEE Transactions on Advanced Packaging, vol. 30, issue 4, pp. 712-724, or in the one by Gorham W. F., 1966: "A New, General Synthetic Method for the Preparation of Linear Poly-p-xylylene, J. Polym. Sci. Part A-1 Vol. 4, p. 3027-3039". Specifically, it may be advantageous to use a polymer material which imparts, in addition, mechanical properties different from those of a ceramic material, notably in terms of elasticity and ductility.

Furthermore, the advantage of using several infiltration layers lies in the fact of increasing the number of interfaces and thus increasing the diffusion pathway.

Thus, the structure described has a maximum compactness of the spherical particles in this space, which have an open porosity corresponding to an assembly of connected pores contributing to the permeability of a material.

The structure furthermore offers a large total external surface area of the beads, making it possible to create as many interfaces between the beads and thus to compartmentalize all of the permeation failing domains.

Figure 4:
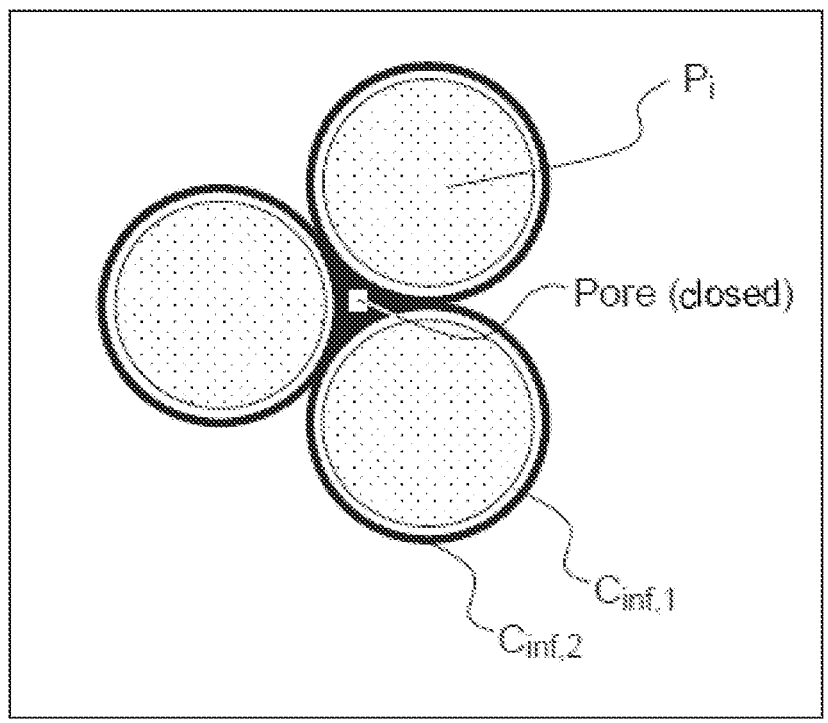
FIG. 4 illustrates an enlarged view of an example of the particle structure used in the invention in which the particles are covered with two infiltration layers so as to close off the open porosity of said structure.

The use of conformal deposition (that makes it possible to obtain a layer of constant thickness at any point of the target surface and that matches the shape of the reliefs existing at the surface, here the external surface area of the beads) makes it possible to fill the open porosity until a compactness of 96% is attained (and therefore to reduce the residual open porosity to 4%). Above this deposition thickness, the open porosity is converted to closed porosity. The closed porosity is located where empty pockets are formed at bead contact points, these empty pockets not being connected to one another and therefore being localized and forming a closed porosity. FIG. 4 thus illustrates the localized closed porosity, in the case of particles Pi covered with two infiltration layers $C_{inf,1}$ and $C_{inf,2}$.

This high and controlled compactness is favourable to the reduction of uncontrolled porosity and other permeation failings.

Thus, according to the present invention, by forming compartments with beads that are ordered in a very compact manner, the small amount of porosity is then filled in a controlled manner by the deposition of the infiltration layer or layers.

Figure 5A:
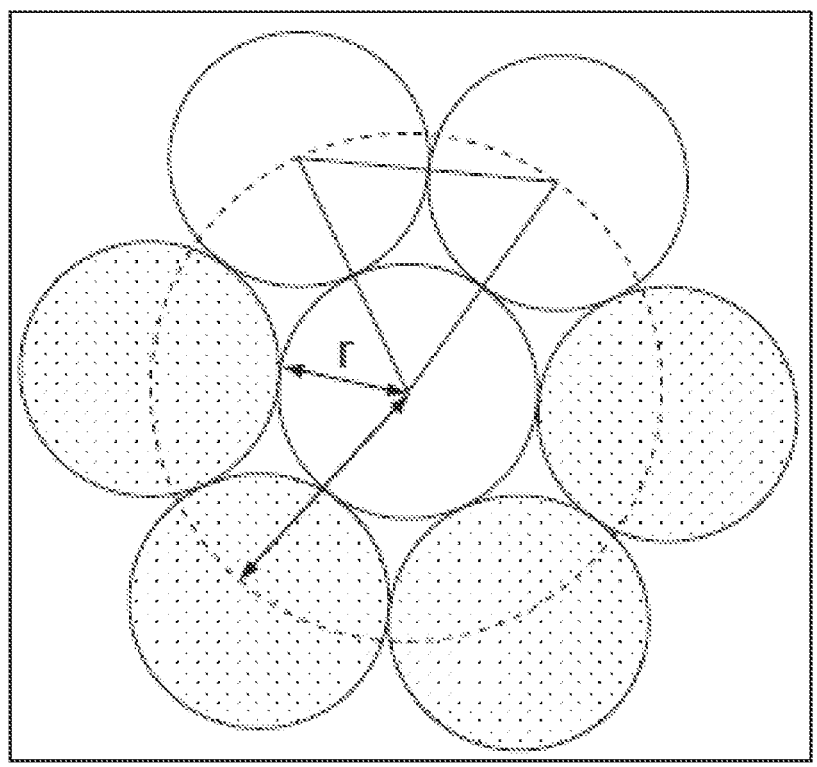
FIGS. 5a and 5b illustrate an example of opal structure that can be used in a layer of an encapsulation device according to the invention.
Figure 5B:
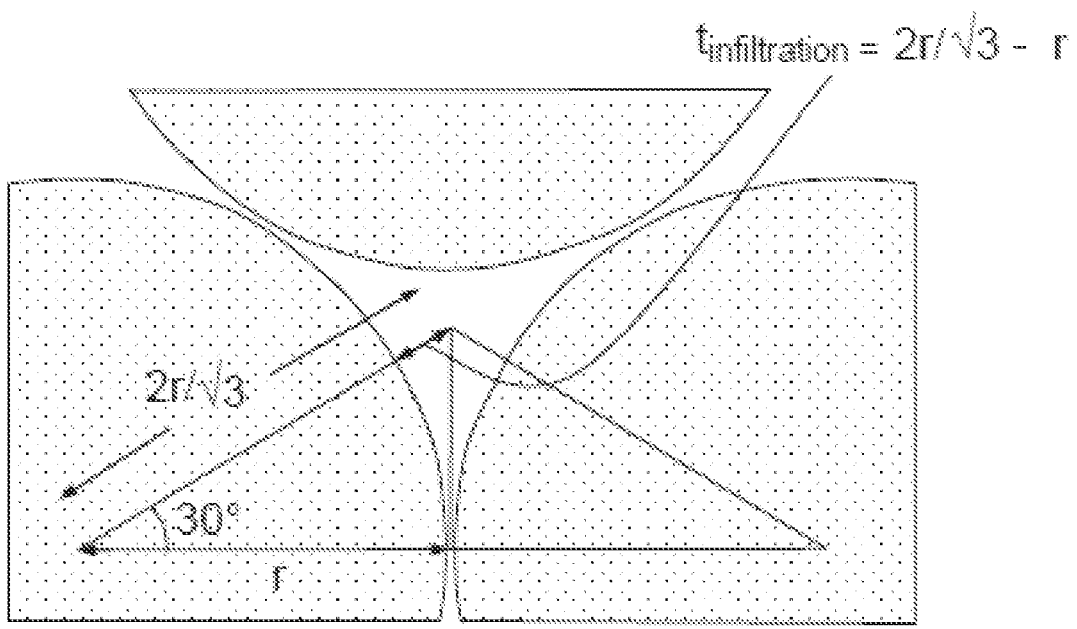

Within the context of an opal structure produced from silica beads and illustrated by virtue of FIGS. 5a and 5b, it may be noted that the total thickness of the infiltration layers is limited by the following factor: 0.15×r, r being the radius of a spherical particle. Specifically, the relationship:

$t_{infiltration} = (2\sqrt{3}-1)*r = 0.15*r$ provides the condition of closing of the pores, and therefore $t_{infiltration}$ corresponds to the maximum thickness of the infiltration film that it is possible to deposit. Above this deposition thickness, the open porosity is converted to closed porosity.

In the case of an opal stack, a high compactness (74% with a maximum stack of spheres of the same size) and a high developed surface area $A_{opal}$, with respect to the surface area of a film comprising said spheres $A_{film}$, are demonstrated, said surface areas being linked by the equation below:

$$\frac{A_{opal}}{A_{film}} = \frac{0.74 \times l \times w \times t}{4/3\pi r^3} \times \frac{4\pi r^2}{l \times w} = \frac{2.22t}{r}$$

with r: radius of the sphere;
  l and w respectively being the length and the width of the film deposited, composed of spheres of radius r, stacked over a thickness t, the surface area developed by the spheres $A_{opal}$ is equal to 2.22*(t/r) times the geometric surface area defined by the product l.w.

Thus, for r=100 nm and t=5 μm, a developed surface area equal to 111 times that of the film is typically obtained.

The advantages of the encapsulation stack of the present invention are notably the following:

- the possibility of controlling the size, material and positioning, by modifying the parameters of the particle transfer process. More specifically, the positioning is brought about by the possibility of depositing the beads at some locations and not others, in order to give them a particular pattern, for example over a sensitive zone to be protected and not over an inactive zone, enabling a wide choice of adaptation;
- the possibility of alternating the types of particles on the stack levels, for example a first type of particle having a higher permeability for the $O_2$ molecules than those of $H_2O$, and a second type of particle that is the reverse of the first type, the combination thus improving the final result;
- a single infiltration layer deposition step (or even two) for the treatment of the whole of the organized structure of particles, contrary to a solution that alternates the depositions one after the other in order to create interfaces and lengthen the diffusion pathway of the oxygen and/or water vapour particles. This helps to consequently reduce the production cost, for an equal number of interfaces;
- obtaining a device architecture that makes it possible both to lengthen the (oxygen, water vapour) diffusion pathway and to compartmentalize the permeation failings, in an isotropic manner. It should be noted that certain solutions from the known prior art and notably that described in patent application WO 2008/094352 also describe a solution that makes it possible to have an isotropic effect, nevertheless their drawbacks have been mentioned above in the present description, namely an incompatibility between the laser structuring and etching techniques. Such methods are known as subtractive methods. Specifically, material is subtracted and removed in order to give it a certain shape. In the presence of sensitive devices, the application of these methods requires a technological (thermal, chemical) compatibility with the hygroscopic materials, and an (etching, ablation) selectivity in order to remove the desired material without degrading the sensitive materials. These techniques give rise to a processing difficulty accompanied by high costs.

In the present invention, an additive method has been used. Specifically, material is deposited, without selectivity constraints, making it possible to ensure simpler processing and lower costs. The isotropic nature is ensured not only in the direction vertical to the substrate (permeation vertical to the device) but also in the direction parallel to the substrate (permeation lateral to the device). The isotropic effect and the encapsulation level are uniform in the stack.

In the encapsulation device of the invention, the particles used are preferably of spherical shape that may be of the same size. They may have particle diameters of between 50 nm and 5 µm, preferably of between 100 nm and 1 µm. Specifically, since the total thickness of the stack is a function of the diameter of the beads, the smaller the diameter, the smaller the total thickness, a factor that is desired in numerous applications. Nevertheless, below a certain particle size, the possible thickness of the infiltration layer is very small (0.15×radius) and therefore more complex to produce.

It is possible to use an alternation between two different sizes, making it possible to obtain a particle size gradient and therefore a permeation effect gradient. For example, it may be envisaged firstly to deposit particles of very small size in order to cover a high substrate topography, then to increase the size of the particles in order to deposit fewer layers.

The particles may be, for example, made of materials of oxide, carbide, oxycarbide or polymer type. More specifically, they may be made of $SiO_2$ or $Al_2O_3$ or based on carbide (SiC, WC, ZrC), or else of oxycarbide type such as SiOC or ZrOC.

The particles may also be made of polymer, for example belonging to the family of parylenes, more specifically they may be made of PPX-C (poly(chloro-p-xylylene)) or of PPX-N (poly(p-xylylene)) or of PPX-D (poly(dichloro-p-xylylene)).

It being possible for the infiltration layers to be composed of materials such as: oxides, nitrides, oxynitrides and polymers.

Advantageously, the infiltration layer is made of $Al_2O_3$, known for its very good encapsulation properties owing to a low permeation, the second layer being made of polymer, preferably made of parylene capable of being deposited very conformally around said particles and thus making it possible to lengthen the diffusion pathway of the $O_2/H_2O$ species.

Typically, in the case of an opal structure, the total thickness of the infiltration layers must be greater than a value equal to 0.15×particle radius, in order to close off the porosity of the structure.

Typically, the thickness of the layer thus produced of particles covered with infiltration layers may be between 1 and 5 µm.

Exemplary Embodiment of an Encapsulation Stack of the Invention for a Microbattery:

Carried out on a thin glass substrate, for example having a thickness of 40 µm, are, successively:
- the deposition of 10 monolayers of spherical $SiO_2$ particles having a diameter Φ=500 nm (the assembly having an open porosity);
- the deposition of a first infiltration layer of $Al_2O_3$ having a thickness of 30 nm by the ALD technique;
- the deposition of a second infiltration layer of parylene PPX having a thickness of 20 nm by vacuum polymerization.

The total deposited thickness (50 nm) of the infiltration layers is sufficient to enable the open porosity to be converted to closed porosity.

The encapsulation device, also referred to as a cover, formed by the substrate and the stack of 10 monolayers deposited on top, is then transferred on top of a sensitive device, for example a lithium microbattery.

The transfer of the cover thus formed is carried out for example by polymer sealing (polymerization of an adhesive between the cover and the device to be protected).

One variant of the above example consists in depositing the monolayers directly onto the sensitive device, however the deposition onto a preliminary substrate, then transferred to the sensitive device, makes it possible to avoid compatibility constraints (chemical, thermal, control of the deposition atmosphere, etc.) between the monolayer deposition parameters and the sensitive device.

The invention claimed is:

1. An encapsulation device comprising at least one assembly containing particles comprising at least a first material, said assembly having an open porosity,
   the particles being distributed to form a hexagonal or face-centred cubic stack of said particles wherein a degree of compactness of said particles in the stack is greater than around 50%, and the particles being at least in part covered conformally by at least one layer referred to as an infiltration layer; wherein at least said infiltration layer is configured to close off the porosity of the assembly comprising the particles covered by said infiltration layer, in the form of pores that are not connected to one another.

2. The encapsulation device according to claim 1, comprising a substrate on which said assembly containing said particles is produced.

3. The encapsulation device according to claim 2, in which said substrate is configured to attain a stack of monolayers on the substrate.

4. The encapsulation device according to claim 1, in which the first material is of oxide or carbide or oxycarbide type.

5. The encapsulation device according to claim 1, in which the first material is a polymer belonging to the family of parylenes.

6. The encapsulation device according to claim 1, in which said assembly comprises particles of at least two types of materials, a first type of material having a higher permeability for $O_2$ molecules than for $H_2O$ molecules, the second type of material having a higher permeability for $H_2O$ molecules than for $O_2$ molecules.

7. The encapsulation device according to claim 1, in which said particles are covered with at least one infiltration layer composed of oxide or nitride or oxynitride or polymer.

8. The encapsulation device according to claim 1, in which said particles are covered with at least a first infiltration layer made of oxide or nitride or oxynitride, and a second infiltration layer made of polymer belonging to the family of parylenes.

9. The encapsulation device according to claim 1, in which the particles have sizes between around 50 nanometres and 5 microns.

10. The encapsulation device according to claim 1, in which the particles have at least two different sizes, making it possible to produce a particle size gradient, the gradient being obtained going from the substrate, with a succession of layers.

11. The encapsulation device according to claim 1, in which a thickness of the infiltration layer is less than around one micron.

12. The encapsulation device according to claim 1, in which said assembly comprising said particles has a thickness between around 1 micron and 5 microns.

13. The encapsulation device according to claim 1, wherein the encapsulation device is positioned on one face of a sensitive device.

14. The encapsulation device according to claim 13, in which said encapsulation device comprises a substrate.

15. The encapsulation device according to claim 13, in which the sensitive device is a microbattery.

16. The encapsulation device according to claim 13, in which the sensitive device is an organic light-emitting diode.

17. The encapsulation device according to claim 14, comprising a sealing adhesive between said sensitive device and said encapsulation device.

18. A process for producing an encapsulation device according to one of claim 1, comprising the following steps:
production of an assembly containing particles comprising at least a first material, said assembly having an open porosity, said particles being distributed over a geometric structure that has a degree of compactness of said particles of greater than around 50% and preferably of greater than 60%;
infiltration of said assembly of particles by at least one infiltration layer deposited by a conformal technique, making it possible to deposit said infiltration layer around said particles and to close off said porosity, open before this deposition step, in the form of pores that are not connected to one another.

19. The process for producing an encapsulation device according to claim 18, in which the compact assembly of particles is produced by a technique for transferring an assembly of colloidal monolayers in a transfer liquid to the surface of a substrate.

20. The process for producing an encapsulation device according to claim 19, in which the transfer technique is a Langmuir Blodgett or Langmuir Shaefer transfer technique.

21. The process for producing an encapsulation device according to claim 18, in which the infiltration step is carried out by atomic layer deposition (ALD) of thin films.

22. The process for producing an encapsulation device according to claim 18, in which the infiltration step is carried out by chemical vapour deposition, or plasma-enhanced chemical vapour deposition.

23. The encapsulation device according to claim 1, wherein the infiltration layer coverts at least in part the open porosity to a closed porosity.

24. The encapsulation device according to claim 1, wherein the geometric structure has a degree of compactness of said particles of greater than around 60%.

25. The encapsulation device according to claim 1, wherein the geometric structure is hexagonal.

26. The encapsulation device according to claim 1, wherein the geometric structure is face-centred cub.

* * * * *